US012765326B2

(12) United States Patent
Lee et al.

(10) Patent No.: US 12,765,326 B2
(45) Date of Patent: Oct. 13, 2026

(54) MITIGATION OF SADDLE DEFORMATION OF SUBSTRATES USING FILM DEPOSITION AND EDGE ION IMPLANTATION

(71) Applicant: Applied Materials, Inc., Santa Clara, CA (US)

(72) Inventors: Wonjae Lee, Fremont, CA (US); Pradeep Kumar Subrahmanyan, San Jose, CA (US); D. Jeffrey Lischer, Acton, MA (US); Frank Sinclair, Hartland, ME (US)

(73) Assignee: Applied Materials, Inc., Santa Clara, CA (US)

( * ) Notice: Subject to any disclaimer, the term of this patent is extended or adjusted under 35 U.S.C. 154(b) by 292 days.

(21) Appl. No.: 18/431,870

(22) Filed: Feb. 2, 2024

(65) Prior Publication Data

US 2024/0266174 A1 Aug. 8, 2024

Related U.S. Application Data

(60) Provisional application No. 63/511,414, filed on Jun. 30, 2023, provisional application No. 63/502,452,
(Continued)

(51) Int. Cl.
*H10P 74/20* (2026.01)
*C23C 14/48* (2006.01)
(Continued)

(52) U.S. Cl.
CPC ............ *H10P 74/203* (2026.01); *C23C 14/48* (2013.01); *C23C 14/54* (2013.01); *C23C 14/547* (2013.01);
(Continued)

(58) Field of Classification Search
CPC ............... H10P 74/203; H10P 14/6518; H10P 14/6539; H10P 30/20; H10P 30/40;
(Continued)

(56) References Cited

U.S. PATENT DOCUMENTS 10,754,319 B1 8/2020 Good et al.
10,818,611 B2 10/2020 Chang et al.
(Continued)

FOREIGN PATENT DOCUMENTS

CN 111725051 A 9/2020
CN 113594309 A 11/2021
(Continued)

OTHER PUBLICATIONS

International Search Report and Written Opinion for International Application No. PCT/US2024/014670, mailed Jun. 10, 2024, 8 Pages.
(Continued)

*Primary Examiner* — J. E. Schoenholtz
(74) *Attorney, Agent, or Firm* — Lowenstein Sandler LLP

(57) ABSTRACT

Disclosed systems and techniques are directed to correct an out-of-plane deformation (OPD) of a substrate. The techniques include obtaining, using optical inspection data, a profile of the out-of-plane deformation of the substrate and identifying, using the obtained profile, one or more parameters characterizing a saddle-shaped stress of the substrate. The techniques further include computing, using the one or more identified parameters, one or more characteristics of a stress-compensation layer (SCL) for the substrate and causing the SCL to be deposited on the substrate. The techniques further include causing a stress-mitigation beam to be applied to a plurality of edge regions of the SCL, wherein settings of the stress-mitigation beam are determined using the one or more identified parameters.

20 Claims, 12 Drawing Sheets

Related U.S. Application Data filed on May 16, 2023, provisional application No. 63/502,448, filed on May 16, 2023, provisional application No. 63/502,447, filed on May 16, 2023, provisional application No. 63/491,170, filed on Mar. 20, 2023, provisional application No. 63/444,158, filed on Feb. 8, 2023.

(51) Int. Cl.

| | |
|---|---|
| ***C23C 14/54*** | (2006.01) |
| ***G01B 9/02*** | (2022.01) |
| ***G01B 11/16*** | (2006.01) |
| ***H10P 14/60*** | (2026.01) |
| ***H10P 14/694*** | (2026.01) |
| ***H10P 30/20*** | (2026.01) |
| ***H10P 30/40*** | (2026.01) |
| ***H10P 72/00*** | (2026.01) |
| ***H10P 74/00*** | (2026.01) |
| ***H10W 42/00*** | (2026.01) |

(52) U.S. Cl.

CPC .......... *G01B 9/02095* (2013.01); *G01B 11/16* (2013.01); *G01B 11/162* (2013.01); *H10P 14/6518* (2026.01); *H10P 14/6539* (2026.01); *H10P 30/20* (2026.01); *H10P 30/40* (2026.01); *H10P 72/0616* (2026.01); *H10P 74/23* (2026.01); *H10W 42/121* (2026.01); *H10P 14/69433* (2026.01)

(58) Field of Classification Search

CPC ................. H10P 72/0616; H10P 74/23; H10P 14/69433; H10P 50/00; C23C 14/48; C23C 14/54; C23C 14/547; C23C 14/18; G01B 9/02095; G01B 11/16; G01B 11/162; H10W 42/121

See application file for complete search history.

(56) References Cited

U.S. PATENT DOCUMENTS

| | | | |
|---|---|---|---|
| 10,847,419 | B2 | 11/2020 | Miller et al. |
| 2005/0278126 | A1 | 12/2005 | Rosakis et al. |
| 2006/0123919 | A1 | 6/2006 | Lovell et al. |
| 2006/0276977 | A1 | 12/2006 | Rosakis et al. |
| 2007/0180919 | A1 | 8/2007 | Rosakis et al. |
| 2011/0037155 | A1 | 2/2011 | Pagaila |
| 2012/0286285 | A1 | 11/2012 | Godet et al. |
| 2014/0107998 | A1 | 4/2014 | Vukkadala et al. |
| 2016/0005662 | A1 | 1/2016 | Yieh et al. |
| 2017/0125268 | A1 | 5/2017 | Dang et al. |
| 2017/0162522 | A1 | 6/2017 | Chang et al. |
| 2017/0178891 | A1 | 6/2017 | Batinica et al. |
| 2017/0287752 | A1 | 10/2017 | Godet et al. |
| 2018/0067403 | A1* | 3/2018 | deVilliers ............... H10P 50/00 |
| 2018/0329310 | A1 | 11/2018 | Coskun et al. |
| 2019/0041758 | A1 | 2/2019 | Van Dijk et al. |
| 2019/0287854 | A1 | 9/2019 | Miller et al. |
| 2019/0378737 | A1 | 12/2019 | Gutman et al. |
| 2019/0393069 | A1 | 12/2019 | Paranjpe et al. |
| 2020/0118822 | A1 | 4/2020 | Falk et al. |
| 2021/0047729 | A1 | 2/2021 | Yao et al. |
| 2021/0050411 | A1 | 2/2021 | Zhang et al. |
| 2021/0247701 | A1 | 8/2021 | Li et al. |
| 2021/0264076 | A1 | 8/2021 | Yamamoto et al. |
| 2022/0068648 | A1 | 3/2022 | Falk et al. |
| 2022/0344171 | A1* | 10/2022 | Varghese ................ H10P 30/40 |
| 2022/0344282 | A1 | 10/2022 | Subrahmanyan et al. |
| 2024/0266186 | A1 | 8/2024 | Lin et al. |

FOREIGN PATENT DOCUMENTS

| | | | |
|---|---|---|---|
| JP | 2001068429 | A | 3/2001 |
| JP | 2020148865 | A | 9/2020 |
| KR | 20180021133 | A | 2/2018 |
| KR | 20200015426 | A | 2/2020 |
| WO | 2017038026 | A1 | 3/2017 |
| WO | 2022119732 | A1 | 6/2022 |

OTHER PUBLICATIONS

International Search Report and Written Opinion for International Application No. PCT/US2024/014674, mailed Jun. 10, 2024, 9 Pages.

International Search Report and Written Opinion for International Application No. PCT/US2024/014676, mailed Jun. 10, 2024, 10 Pages.

International Search Report and Written Opinion for International Application No. PCT/US2024/014884, mailed May 27, 2024, 08 Pages.

International Search Report and Written Opinion for International Application No. PCT/US2024/014939, mailed Jun. 14, 2024, 09 Pages.

* cited by examiner

MITIGATION OF SADDLE DEFORMATION OF SUBSTRATES USING FILM DEPOSITION AND EDGE ION IMPLANTATION

RELATED APPLICATIONS

This application claims the benefit of U.S. Provisional Patent Application No. 63/444,158, filed Feb. 8, 2023, entitled "Mitigation of stress and deformation in wafers"; U.S. Provisional Patent Application No. 63/491,170, filed Mar. 20, 2023, entitled "Optimized film deposition and ion implantation for mitigation of stress and deformation in wafers"; U.S. Provisional Patent Application No. 63/502,447, filed May 16, 2023, entitled "Mitigation of saddle deformation of wafers using film deposition and edge ion implantation"; U.S. Provisional Patent Application No. 63/502,448, filed May 16, 2023, entitled "Influence function-based mitigation of wafer deformation with film deposition and ion implantation"; U.S. Provisional Patent Application No. 63/502,452, filed May 16, 2023, entitled "Cylindric decomposition for efficient mitigation of wafer deformation with film deposition and ion implantation"; U.S. Provisional Patent Application No. 63/511,414, filed Jun. 30, 2023, entitled "Wafer stress management for precise wafer-to-wafer bonding," the contents of which are incorporated by reference in their entirety herein.

TECHNICAL FIELD

The disclosure pertains to semiconductor manufacturing, including manufacturing of wafers.

BACKGROUND

Modern semiconducting devices, such as processing circuits, memory devices, light detectors, solar cells, light-emitting semiconductor devices, and the like, are often manufactured on silicon wafers (or other suitable substrates). Wafers may undergo numerous processing operations, such as physical vapor deposition, chemical vapor deposition, etching, photo-masking, polishing, and/or various other operations. In a continuous effort to reduce the cost of semiconductor devices, multi-layer stacks of dies, insulating films, patterned and/or doped semiconducting films, and/or other features are often deposited on a single wafer, resulting in high aspect ratio devices, which are used, e.g., in 3D flash memory devices and other applications. Deposition, patterning, etching, polishing, etc., of stacks of multi-layered structures often result in significant stresses applied to the underlying wafers. Such stresses lead to both an out-of-plane distortion and an in-plane distortion of features supported by the wafers. These distortions result in misalignment of deposited features and can significantly degrade quality of manufactured devices.

BRIEF DESCRIPTION OF THE DRAWINGS

The present disclosure will be understood more fully from the detailed description given below and from the accompanying drawings of various embodiments of the disclosure.

FIG. 8A illustrates arc implants in which a uniform ion implantation dose is applied within a certain equal-width edge area of a stress-compensation film, according to at least one embodiment. FIG. 8B illustrates crescent edge implants in which a uniform ion implantation dose is applied within an edge area of varying (with the azimuthal angle) thickness, according to at least one embodiment. FIG. 8C illustrates gradient edge implants in which a non-uniform ion implantation dose is applied within an edge area, according to at least one embodiment. FIG. 8D illustrates custom-shaped ion implants, according to at least one embodiment.

SUMMARY

Figure 1A:
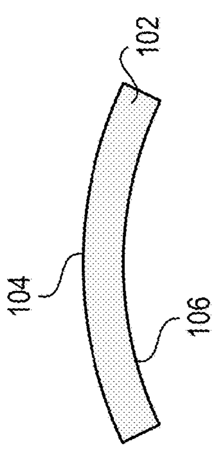
FIGS. 1A-E illustrate schematically a process of stress-correcting the back side-deposited film with an additional ion implantation, according to at least one embodiment.

In one embodiment, disclosed is a method to correct an out-of-plane deformation of a substrate, including obtaining, using optical inspection data, a profile of the out-of-plane deformation of the substrate. The method further includes identifying, using the obtained profile, one or more parameters characterizing a saddle-shaped stress of the substrate. The method further includes computing, using the one or more identified parameters, one or more characteristics of a stress-compensation layer (SCL) for the substrate. The method further includes causing the SCL to be deposited on the substrate and causing a stress-mitigation beam to be applied to a plurality of edge regions of the SCL, wherein settings of the stress-mitigation beam are determined using the one or more identified parameters.

In another embodiment, disclosed is a system that includes a memory and a processing device communicatively coupled to the memory, the processing device is to obtain, using optical inspection data, a profile of an out-of-plane deformation of a substrate. The processing device is further to identify, using the obtained profile, one or more parameters characterizing a saddle-shaped stress of the substrate. The processing device is further to compute, using on the one or more identified parameters, one or more characteristics of a stress-compensation layer (SCL) for the substrate. The processing device is further to cause a stress-mitigation beam to be applied to a plurality of edge regions of the SCL, wherein settings of the stress-mitigation beam are determined using the one or more identified parameters.

In another embodiment, disclosed is a semiconductor manufacturing system that includes one or more processing chambers to process a substrate and a computing device. The computing device is to obtain, using optical inspection data, a profile of the out-of-plane deformation of the substrate and identify, using the obtained profile, one or more parameters characterizing a saddle-shaped stress of the substrate. The computing device is further to compute, using the one or more identified parameters, one or more characteristics of a stress-compensation layer (SCL) for the substrate, cause the SCL to be deposited on the substrate, and cause a stress-mitigation beam to be applied to a plurality of edge regions of the SCL, wherein settings of the stress-mitigation beam are determined using the one or more identified parameters.

In yet another embodiment, disclosed is a non-transitory computer-readable memory storing instructions thereon that, when executed by a processing device, cause the processing device to perform operations that include identifying, using the obtained profile, one or more parameters characterizing a saddle-shaped stress of the substrate. The operations further include computing, using the one or more identified parameters, one or more characteristics of a stress-compensation layer (SCL) for the substrate. The operations further include cause a stress-mitigation beam to be applied to a plurality of edge regions of the SCL, wherein settings of the stress-mitigation beam are determined using the one or more identified parameters, wherein settings of the ion implantation are determined using the one or more identified parameters.

DETAILED DESCRIPTION

Existing technology includes a number of methods to address wafer deformation. For example, a deformed (warped) wafer with various films and features deposited on one side (referred to as the front side, top side, or main side herein) can be coated on the other side (referred to as the back side or bottom side herein) with a film that exerts a compression stress or tensile stress on the wafer. Such back side-deposited deformation-correcting film, also referred to as a stress-compensation layer herein, usually imparts a uniform (or global) stress to the entire wafer and cannot compensate for local stress modulation and/or anisotropic stress. Additional correction can be achieved by implanting ions into the stress-compensation layer, e.g., using a beam of ions to bombard the stress-compensation layer, to adjust the stress in the stress-compensation layer and, consequently, to further mitigate the deformation of the underlying wafer.

A "wafer," as used herein, refers to any substrate or material surface formed on a substrate upon which film processing is performed during a fabrication process. For example, a wafer surface on which processing can be performed includes materials such as silicon, silicon oxide, silicon nitride, strained silicon, silicon on insulator, carbon doped silicon oxides, amorphous silicon, doped silicon, germanium, gallium arsenide, glass, sapphire, and any other materials such as metals, metal nitrides, metal alloys, and other conductive materials, depending on the application. Wafers include, without limitation, semiconductor wafers. In some instances, wafers can include plastic substrates. Wafers may be exposed to a pretreatment process to polish, etch, reduce, oxidize, hydroxylate, anneal, UV cure, e-beam cure and/or bake the substrate surface. In addition to film processing directly on the surface of the wafer itself, any of the film processing steps disclosed may also be performed on an underlayer formed on the wafer as disclosed in more detail below, and the term "wafer surface" is intended to include such underlayer as the context indicates. Thus, for example, where a film/layer or partial film/layer has been deposited onto a wafer surface, the exposed surface of the newly deposited film/layer becomes the wafer surface. In some embodiments, wafers have a thickness in the range of 0.25 mm to 1.5 mm, or in the range of 0.5 mm to 1.25 mm, in the range of 0.75 mm to 1.0 mm, or more. In some embodiments, wafers have a diameter of about 10 cm, 20 cm, 30 cm, or more.

Figure 5:
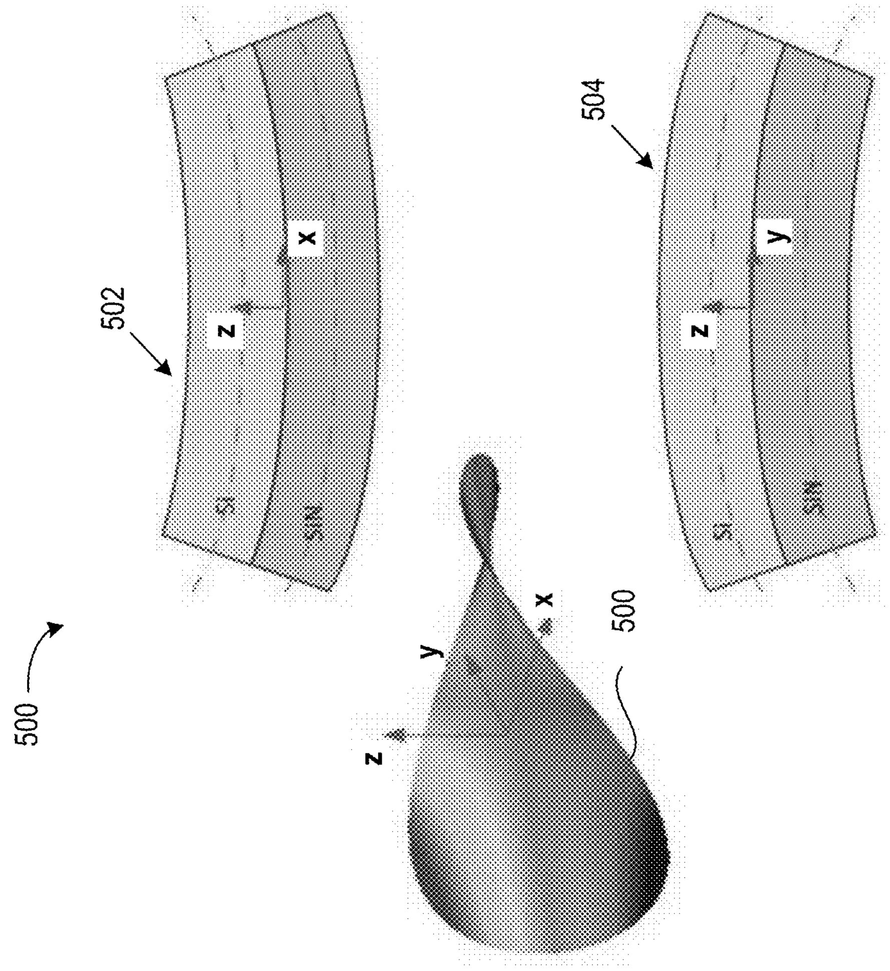
FIG. 5 illustrates an example silicon wafer with a Silicon Nitride film deposited thereon having a saddle-shaped deformation, according to at least one embodiment.

Deposition of stress-compensation layers with ion implantation can be quite efficient in correcting stresses that are uniform and isotropic, $\sigma_{xx}\approx\sigma_{yy}$. On the other hand, mitigating stresses that vary with location x, y on the wafer, $\sigma_{jk}(x, y)$, stresses that are anisotropic, $\sigma_{xx}\neq\sigma_{yy}$, or both is a much more challenging problem. Certain feature patterns can result in stresses that are compressive along one direction, e.g., $\sigma_{xx}<0$, and tensile along a perpendicular direction, $\sigma_{yy}>0$, resulting in saddle-shaped wafers, e.g., as illustrated in FIG. 5. Such saddle-shaped features can arise, for example, in stacks of materials with directional patterning, e.g., patterning of wordlines in flash memory devices. Correcting such anisotropic saddle deformations in wafers remains a difficult task.

Aspects and embodiments of the present disclosure address these and other challenges of the modern semiconductor manufacturing technology by providing for systems and techniques that can mitigate non-uniform and/or anisotropic stresses and deformations of wafers. In some embodiments, a method of mitigating saddle deformations can include identifying principal axes (directions) and a magnitude of a saddle deformation, e.g., $\sigma_{jk}\propto\cos(2\phi+\alpha)$, and identifying properties of a stress-compensation film (layer) capable of causing the stress in the wafer to have a definite sign (e.g., stress that is positive or negative throughout the whole area of the wafer). This causes the wafer's deformation to turn from a saddle to a cylindrical deformation. The method can further include depositing the film with the identified properties and then mitigating high-stress regions of the wafer with ion implantation into the edges of such regions of the film. Residual higher-order (ripple) deformations can then be addressed with further ion implantation into the area of the film.

In one embodiment, a vertical profile of wafer deformation $z=h(r, \phi)$ can be measured using optical metrology techniques. For example, an interferogram of the profile $h(r, \phi)$ can be obtained using optical interferometry measurements. The wafer profile $h(r, \phi)$ can then be represented via a number of parameters that qualitatively and quantitatively characterize geometry of the wafer deformation. In some embodiments, a set of Zernike (or a similar set of) polynomials may be used to represent the wafer profile, $$h(r, \phi) = \sum_j A_j Z_j(r, \phi),$$

where r is the radial coordinate and $\phi$ is the polar angle coordinate within the (average) plane of the wafer. Consecutive coefficients $A_1$, $A_2$, $A_3$, $A_4$ . . . represent weights of specific geometric features (elemental deformations) of the wafer described by the corresponding Zernike polynomials $Z_1(r, \phi)$, $Z_2(r, \phi)$, $Z_3(r, \phi)$, $Z_4(r, \phi)$ . . . . (Herein, the Noll indexing scheme for the Zernike polynomials is being used.) The first three coefficients are of less interest as they describe a uniform shift of the wafer (coefficient $A_1$, associated with the $Z_1(r, \phi)=1$ polynomial), a deformation-free x-tilt that amounts to a rotation around the y-axis (coefficient $A_2$, associated with the $Z_2(r, \phi)=2r \cos \phi$ polynomial), and a deformation-free x-tilt that amounts to a rotation around the x-axis (coefficient $A_3$, associated with the $Z_3(r, \phi)=2r \sin \phi$ polynomial) that can be eliminated by a realignment of the coordinate axes. The fourth coefficient $A_4$ is associated with $Z_4(r, \phi)=\sqrt{3}(2r^2-1)$ and characterizes an isotropic paraboloid deformation ("bow"). The fifth $A_5$ and the sixth $A_6$ coefficients are associated with $Z_5(r, \phi)=\sqrt{6}\, r^2 \sin 2\phi$ and $Z_6(r, \phi)-\sqrt{6}\, r^2 \cos 2\phi$ polynomials, respectively, and characterize a saddle-type deformation. The $A_5$ coefficient characterizes a saddle shape that curves up ($A_5>0$) or down ($A_5<0$) along the diagonal y=x and curves down ($A_5>0$) or up ($A_5<0$) along the diagonal y=−x. The $A_6$ coefficient characterizes a saddle shape that curves up ($A_6>0$) or down ($A_6<0$) along the x-axis and curves down ($A_6>0$) or up ($A_6<0$) along the y-axis. The higher coefficients $A_7$, $A_8$, etc., characterize progressively faster variations of the wafer deformation $h(r, \phi)$ along the radial direction, along the azimuthal direction, or both and collectively represent a residual deformation, $$h_{res}(r, \phi) = h(r, \phi) - \sum_{j=4}^{6} A_j Z_j(r, \phi).$$

Figure 2:
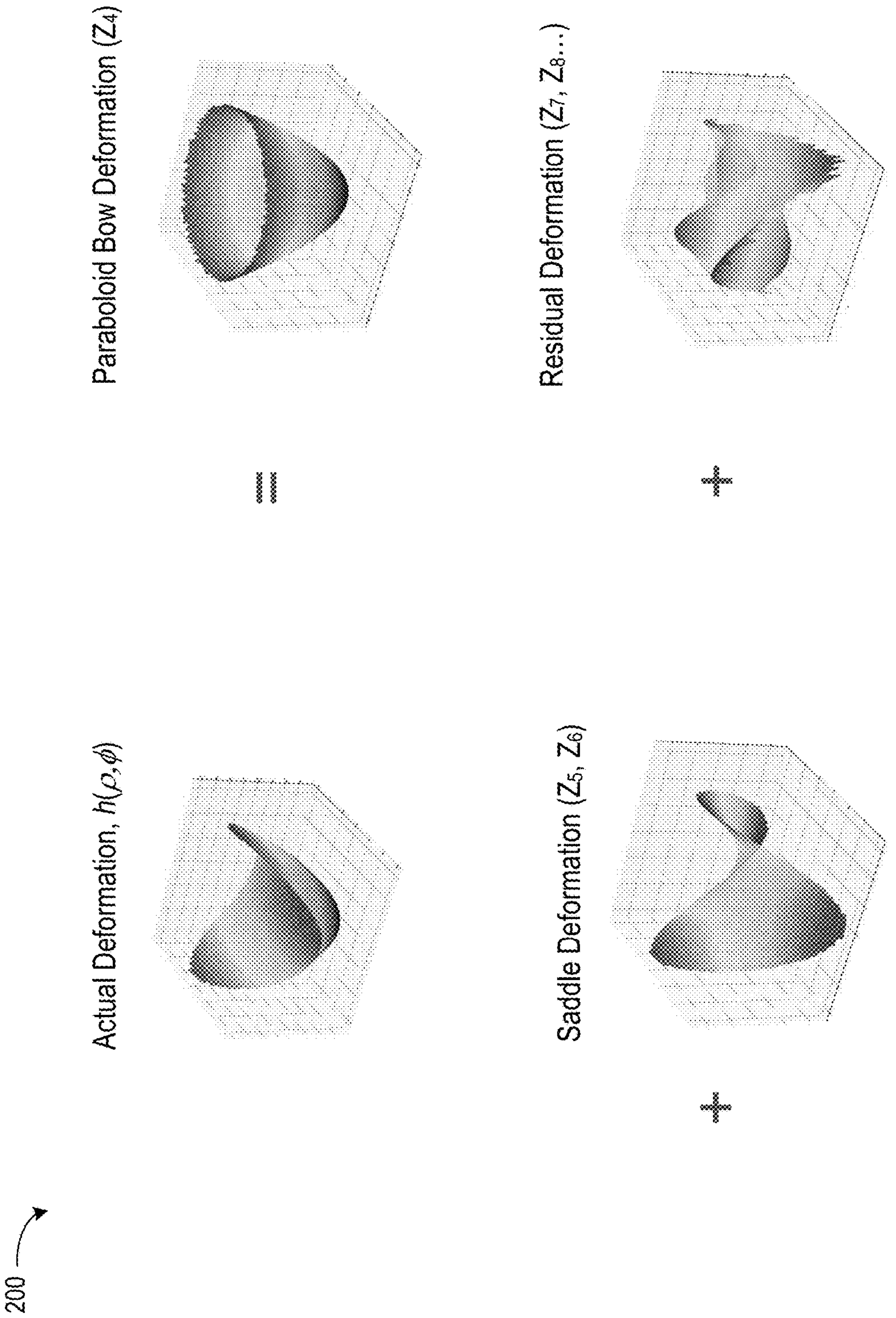
FIG. 2 illustrates an example Zernike polynomial decomposition of one actual deformation (top left) of a wafer, in arbitrary units, into a paraboloid bow deformation (top right), a saddle deformation (bottom left), and a residual deformation (bottom right), according to at least one embodiment.

FIG. 2 illustrates an example Zernike polynomial decomposition 200 of one actual deformation $h(r, \phi)$ (top left) of a wafer, in arbitrary units, into a paraboloid bow deformation $A_4Z_4(r, \phi)$ (top right), a saddle deformation $A_5Z_5(r, \phi)+A_6Z_6(r, \phi)$ (bottom left), and a residual deformation, $h_{res}(r, \phi)$ (bottom right), according to at least one embodiment.

Figure 1B:
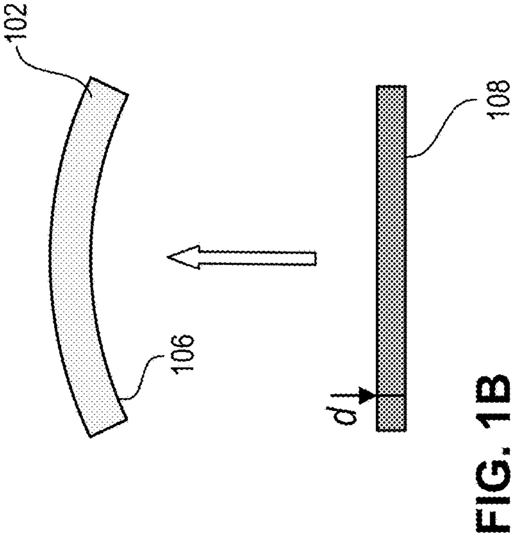

In some embodiments, selection of a thickness d of the stress-compensation film can be made based on a value of the paraboloid bow coefficient $A_4$. FIGS. 1A-E illustrate schematically a process of stress-correcting the back side-deposited film with an additional ion implantation, according to at least one embodiment. FIG. 1A depicts a wafer 102 having a deformation, which can include a paraboloid bow deformation (with negative coefficient $A_4<0$) and other deformations, e.g., a saddle deformation and a residual deformation (both not shown in FIGS. 1A-E for conciseness and ease of viewing). Wafer 102 has a front side 104 and a back side 106. Any number of features (e.g., deposition and/or etching patterns), dies, photo-masks, and/or any other structures can be deposited on or etched in the front side 104. In some embodiments, back side 106 can be free from deposited/etched features/structures. In some embodiments, back side 106 can also have one or more deposited/etched features/structures. FIG. 1B illustrates schematically deposition of a stress-compensation layer on the back side of wafer 102. In some embodiments, stress-compensation layer 108 can include one or more films of different materials. Individual films may have a thickness in the range of 10 nm to 200 nm, or in the range of 20 nm to 180 nm, or in the range of 30 nm to 160 nm, or in the range of 40 nm to 140 nm, or more. A total thickness of the stress-compensating layer may be up to several microns or even more. In some embodiments, stress-compensation layer 108 is deposited at a temperature in the range of 100° C. to 500° C. or higher.

Figure 1C:
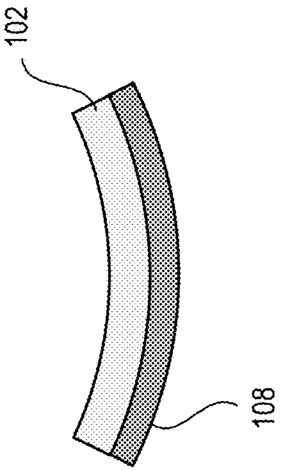

A material (type) of stress-compensation layer 108 can be selected based on the sign of coefficient $A_4$. For example, for a negative bow, $A_4<0$, and stress-compensation layer 108 may be selected to have a tensile stress (as illustrated in FIGS. 1A-E). For silicon wafers, such a film can be a silicon nitride ($Si_3N_4$) film. Conversely, for a positive bow, $A_4>0$, and stress-compensation layer 108 may be selected to have a tensile stress (not shown in FIGS. 1A-E). Stress-compensation layer 108 can be deposited using any suitable deposition techniques including physical vapor deposition (e.g., sputtering), chemical vapor deposition (e.g., plasma-assisted deposition), epitaxy, exfoliation, and/or the like. Deposition can be performed at room temperature or at temperatures different from room temperature (e.g., at an elevated temperature). In some embodiments, a thickness d of stress-compensation layer 108 can be selected to overcorrect the deformation to some degree, e.g., as illustrated in FIG. 1C where a negative paraboloid bow becomes a positive paraboloid bow. The thickness-dependent paraboloid bow correction $A_{corr}(d)$ changes wafer deformation from $h(r, \phi)$ to $h_{corr}(r, \phi)$:

$$h_{corr}(r, \phi) = h(r, \phi) + A_{corr}(d) \cdot Z_4(r, \phi).$$

Figure 1D:
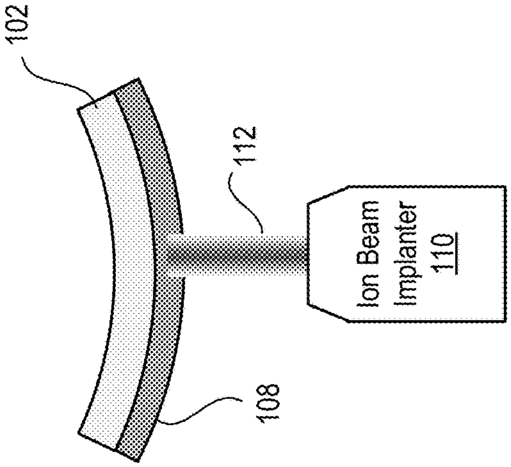

The overcorrection is chosen in conjunction with the implant species, energy, and dose to ensure maximum entitlement from the stress compensation. The overcorrection makes the combined structure of wafer 102 and stress-compensation layer 108 susceptible to further control of stress (and thus deformation of the wafer $h_{corr}(r, \phi)$). As illustrated in FIG. 1D, an ion beam implanter 110 can generate an ion beam 112 that strikes stress-compensation layer 108 and deposits ions therein. Ion beam 112 can carry silicon ions, phosphorus ions, argon ions, neon ions, xenon ions, krypton ions, and/or the like. In some embodiments, the energy and type of ions in ion beam 112 can be selected to limit the implanted ions to the volume of stress-compensation layer 108 without allowing the ions to reach wafer 102. Ions that lodge in stress-compensation layer 108 create substitution defects therein. Additionally, the ions leave a trail of vacancy defects along paths of propagation in stress-compensation layer 108. The substitution defects and/or vacancies modify (e.g., reduce) stress in stress-compensation layer 108 and can reduce the degree of stress overcorrection caused by the film deposition. This causes the combination of wafer 102 and stress-compensation layer 108 to flatten.

Although, for the sake of specificity, a stress-mitigation beam that is used to modify the stress in stress-compensation layer 108 is referred to as ion beam (e.g., ion beam 112) throughout this disclosure, the stress-mitigation beam can include other matter particles (e.g., electrons), electromagnetic waves (e.g., UV light, visible light, infrared light, etc.), and/or a suitable combination thereof. The stress-mitigation beam strikes stress-compensation layer 108 and changes the bonding network of stress-compensation layer 108. For example, the stress-mitigation beam of low energy may interact with surface atoms of stress-compensation layer 108, e.g., removing some of the surface atoms, effectively implementing etching of surface regions of stress-compensation layer 108. The effectiveness of such etching may be controlled by a choice of ion species/radicals/ambient gasses. In another example, the stress-mitigation beam of high energy can deposit ions inside stress-compensation layer 108. Ions and/or photons can break bonds of the bonding network (or crystal lattice) of stress-compensation layer 108 forming vacancies therein, and can further cause annealing due to local heating, UV curing, and/or other effects.

In some embodiments, the number of ions $\Delta N_i$ deposited per small area $\Delta A=\Delta x\Delta y$ of the wafer may be determined using simulations (performed as described in more detail below) based on the local value of the corrected deformation $h_{corr}(r, \phi)$, which may include a saddle deformation, a residual deformation, and the part of the paraboloid bow deformation $A_{corr}(d)+A_4$ that has been overcorrected by the deposition of stress-compensation layer 108. The desired local density $\Delta N_i/\Delta x\Delta y$ of the ions can be delivered by controlling the scanning velocity v of ion beam 112. In some embodiments, ion beam 112 has a profile that can be approximated with a Gaussian function, e.g., the ion flux $j(\sigma)=j_0 \exp(-x^2/a^2-y^2/b^2)$, where x and y are Cartesian coordinates, $j_0$ is the maximum ion flux at the center of the beam, and a and b is are characteristic spreads of the beam along the x-axis and y-axis, respectively. Correspondingly, a point that is located at distance y from the path of the center of the beam receives an ion dose that includes the following number of ions:

$$\frac{\Delta N_i}{\Delta x\Delta y}=\frac{j_0}{v}\int_{-\infty}^{\infty}dxe^{-x^2/a^2-y^2/b^2}=\frac{j_0\sqrt{\pi}}{va}e^{-y^2/b^2}.$$

Correspondingly, by reducing the scanning velocity v, the number of ions received by various regions of stress-compensation layer 108 can be increased, and vice versa. Additionally, ion beam 112 can perform multiple scans with different offsets y so that various points of stress-compensation layer 108 receive multiple doses of ions with different factors $e^{-y^2/b^2}$ that can average to a target dose. For example, after n passes of ion beam implanter 110, each made with a respective velocity $v_k$ at a different distance $y_k$ from the center of ion beam 112 to the area $\Delta x\Delta y$, the total dose of ions received by this area will be $$\frac{\Delta N_i}{\Delta x\Delta y}\Big|_{total}=j_0\sqrt{\pi}\sum_{k=1}^{n}\frac{e^{-y_k^2/b^2}}{av_k}.$$

Figure 1E:
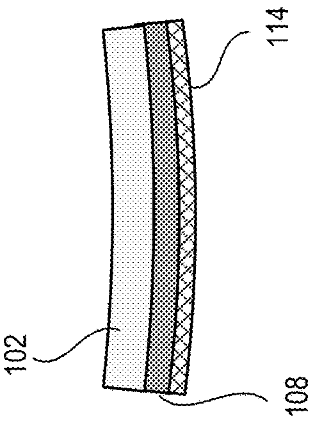

As illustrated in FIG. 1E, an implantation layer 114 formed as part of stress-compensation layer 108 results in a significant mitigation of deformation of wafer 102, and in particular its saddle and residual portions.

Figure 3:
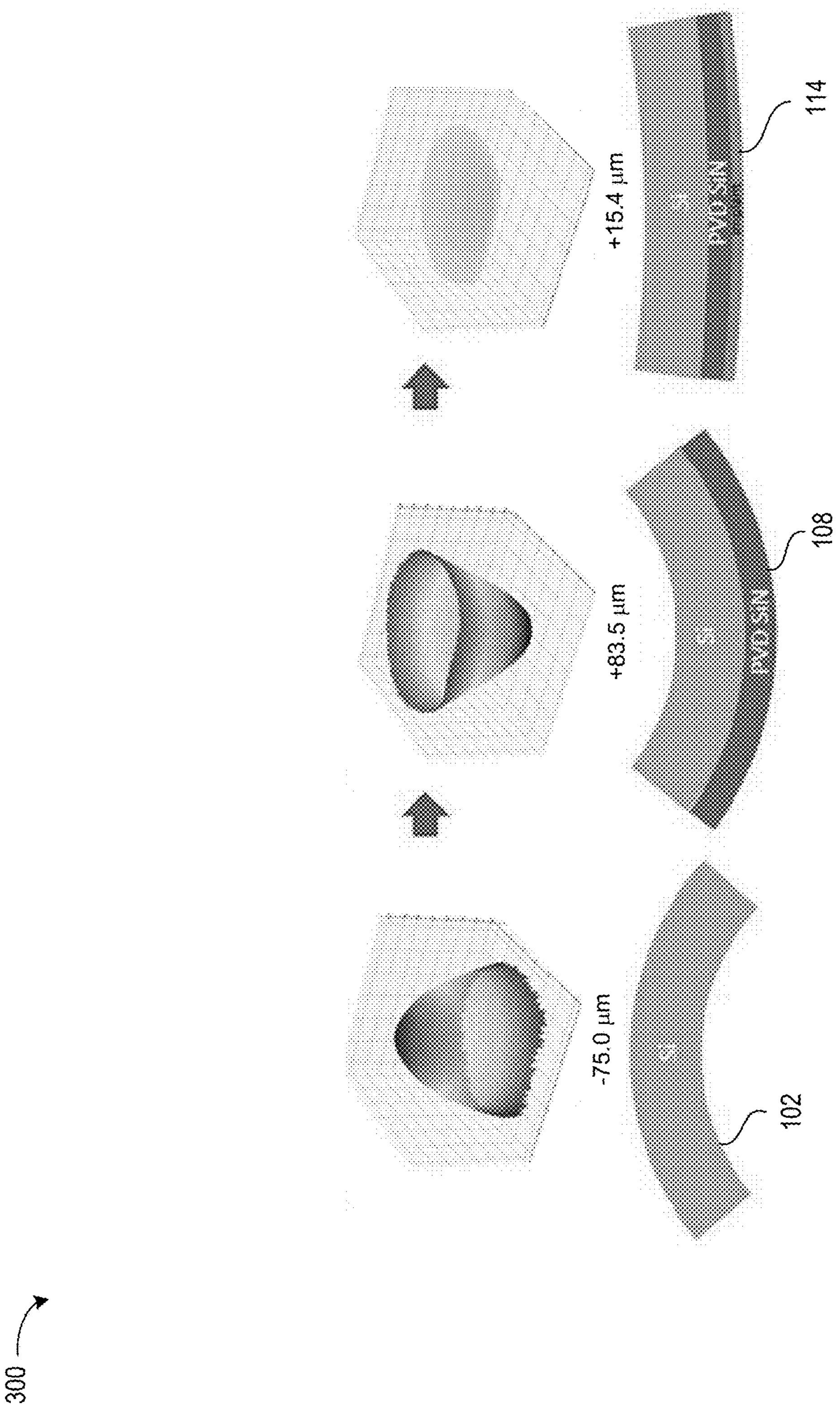
FIG. 3 illustrates stress and deformation mitigation in one example wafer using the process disclosed in relation to FIGS. 1A-E, according to at least one embodiment.
Figure 4:
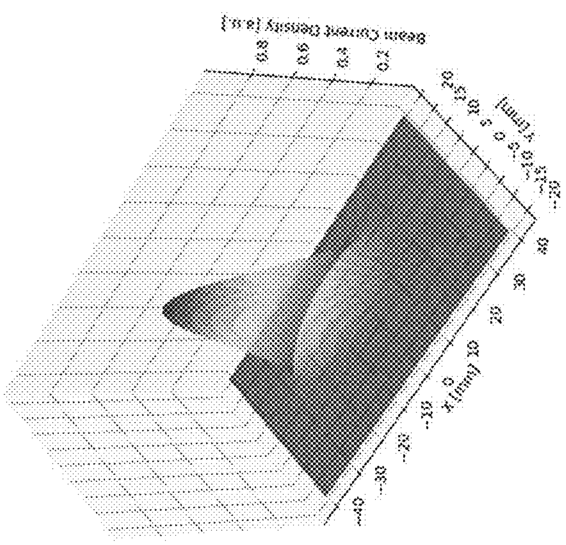
FIG. 4 illustrates one example profile of a Gaussian ion beam that can be used for stress and deformation mitigation in wafers, according to at least one embodiment.

FIG. 3 illustrates stress and deformation mitigation 300 in one example wafer using the process disclosed in relation to FIGS. 1A-E, according to at least one embodiment. As depicted in FIG. 3, a 30 cm Silicon wafer 102 with the maximum negative deformation of −75.0 μm is first overcorrected to the maximum deformation of +83.5 μm using a Silicon Nitride tensile stress-compensation layer 108. The stresses in stress-compensation layer 108 are then reduced by the formation of implantation layer 114 with an ion beam, resulting in a final maximum deformation of +15.4 μm. FIG. 4 illustrates one example profile 400 of a Gaussian ion beam 112 that can be used for stress and deformation mitigation in wafers, according to at least one embodiment.

The techniques of strain and deformation mitigation illustrated in FIGS. 1-3 can also be applied to a wafer having a complex deformation in which stress tensor components $\sigma_{xx}$ and $\sigma_{yy}$ have different signs causing the wafer to have a saddle deformation. FIG. 5 illustrates an example wafer 500 (e.g., a silicon wafer with a Silicon Nitride film deposited thereon) having a saddle-shaped deformation, according to at least one embodiment. As seen in the cross-sectional xz view 502, the stress component $\sigma_{xx}$ may be lower in the wafer (the top layer) than in the film (the bottom layer) deposited on the back side of the wafer. Conversely, as illustrated with the cross-sectional yz view 504, the stress component $\sigma_{yy}$ may be higher in the wafer than in the film. In some embodiments, the state of stress in the wafer may be represented by the location-dependent stress tensor which may be approximated as, $$\sigma(x, y)=\begin{pmatrix}\sigma_{xx} & \sigma_{xy} & \sigma_{xz}\\ \sigma_{yx} & \sigma_{yy} & \sigma_{yz}\\ \sigma_{zx} & \sigma_{zy} & \sigma_{zz}\end{pmatrix}\approx\begin{pmatrix}\sigma_{xx} & 0 & 0\\ 0 & \sigma_{yy} & 0\\ 0 & 0 & 0\end{pmatrix}.$$

This structure of the stress tensor is usually a good approximation since the wafer is typically in a state of pure bending and independent of the shear stresses that are represented by the off-diagonal terms in the stress tensor. Correction of the saddle shape requires special handling in the computation of the dose map and optimization to ensure that additional residual terms are not introduced into the wafer as a result.

Figure 6:
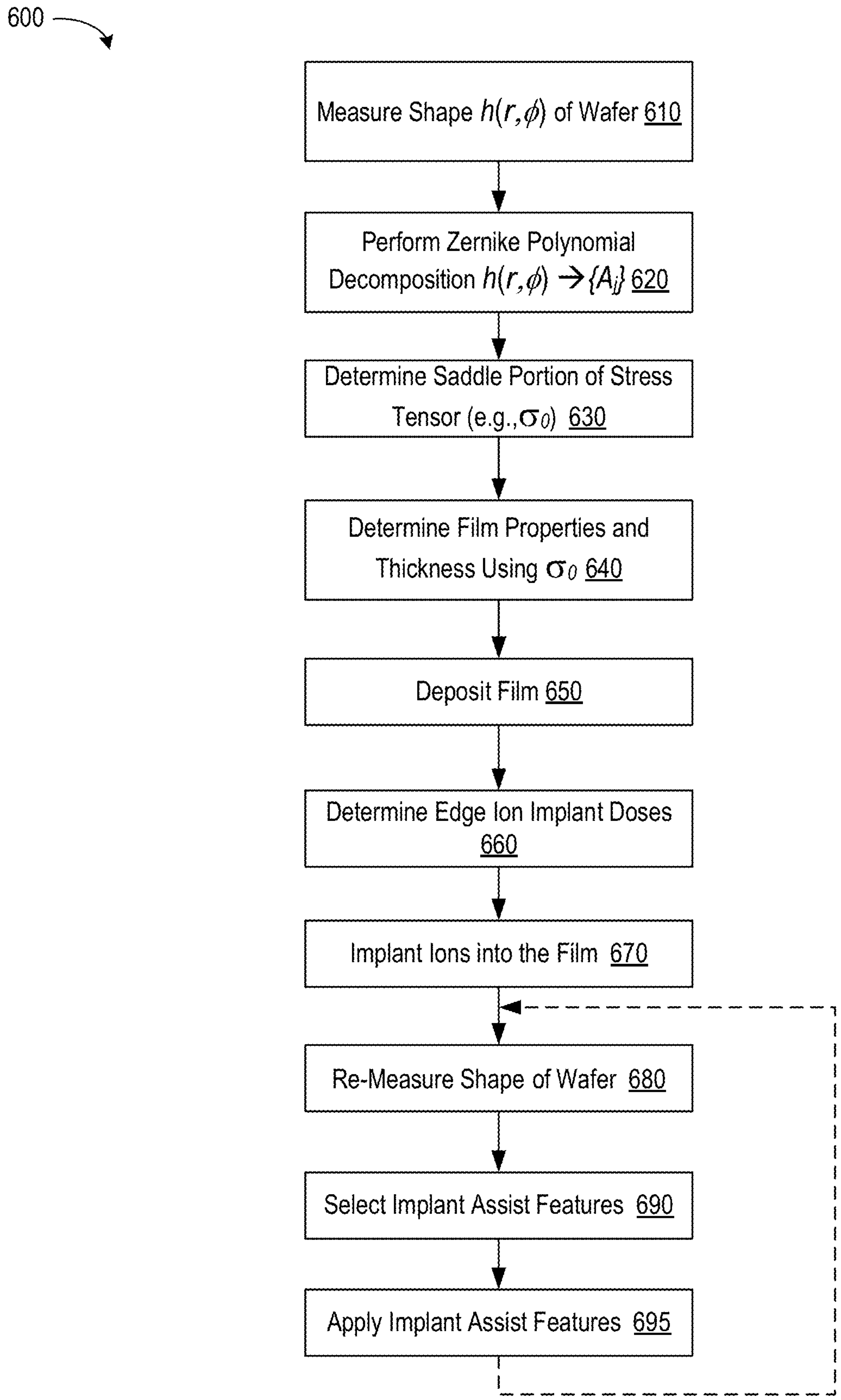
FIG. 6 is a flowchart illustrating an example process of mitigation of saddle-shaped deformations of wafers, according to at least one embodiment.

FIG. 6 is a flowchart illustrating an example process 600 of mitigation of saddle-shaped deformations of wafers, according to at least one embodiment. Process 600 can be performed using a semiconductor manufacturing system that includes one or more processing chambers, e.g., deposition chamber(s), plasma chamber(s), etching chamber(s), polishing chamber(s), film removal chamber(s), beam irradiation chamber(s), optical inspection chamber(s), and/or the like. The processing chambers can be connected to one or more transfer chambers, which can be equipped with robot(s) to handle wafers, e.g., moving wafers into and out of processing chambers. The transfer chamber can further be connected to a load-lock chamber (Front-End Interface) that can be coupled to one or more Front Opening Unified Pod carriers that hold bare wafers, processed wafers, partially processed wafers, and/or the like. Operations performed by the semiconductor manufacturing system, including any, some or all operations of process 600, can be performed responsive to instructions issued by a suitable computing device having a processing logic and memory to store the instructions.

At block 610, process 600 includes measuring a shape of a wafer, e.g., a displacement of a surface (e.g., top surface) of a wafer as a function of some in-plane coordinates, e.g., polar coordinates $z=h(r, \phi)$, Cartesian coordinates, $z=h(x, y)$, or any other suitable coordinates. At block 620, process 600 includes decomposition of the determined shape over a suitable set of polynomials, e.g., Zernike polynomials, and obtaining a set of polynomial expansion coefficients, $\{A_j\}=(A_1, A_2, A_3)\ A_4, A_5, A_6, A_7\ \ldots$, each coefficient in the set characterizing a degree of presence of a particular elemental geometric shape in the wafer's deformation.

At block 630, the deformation expressed via coefficients $\{A_j\}$ may be used to determine a saddle portion of stress tensor $\sigma^{jk}$. The saddle portion refers to a part of the stress tensor that is proportional to $\cos(2\phi+\alpha)$, with a phase $\alpha$ defined orientation of the saddle shape relative to the coordinate axes. Without any loss of generality, it will be assumed for conciseness that $\alpha=0$ (which can be accomplished by a simple rotation of the coordinate system).

Figures 7A, 7B, 7C, 7D:
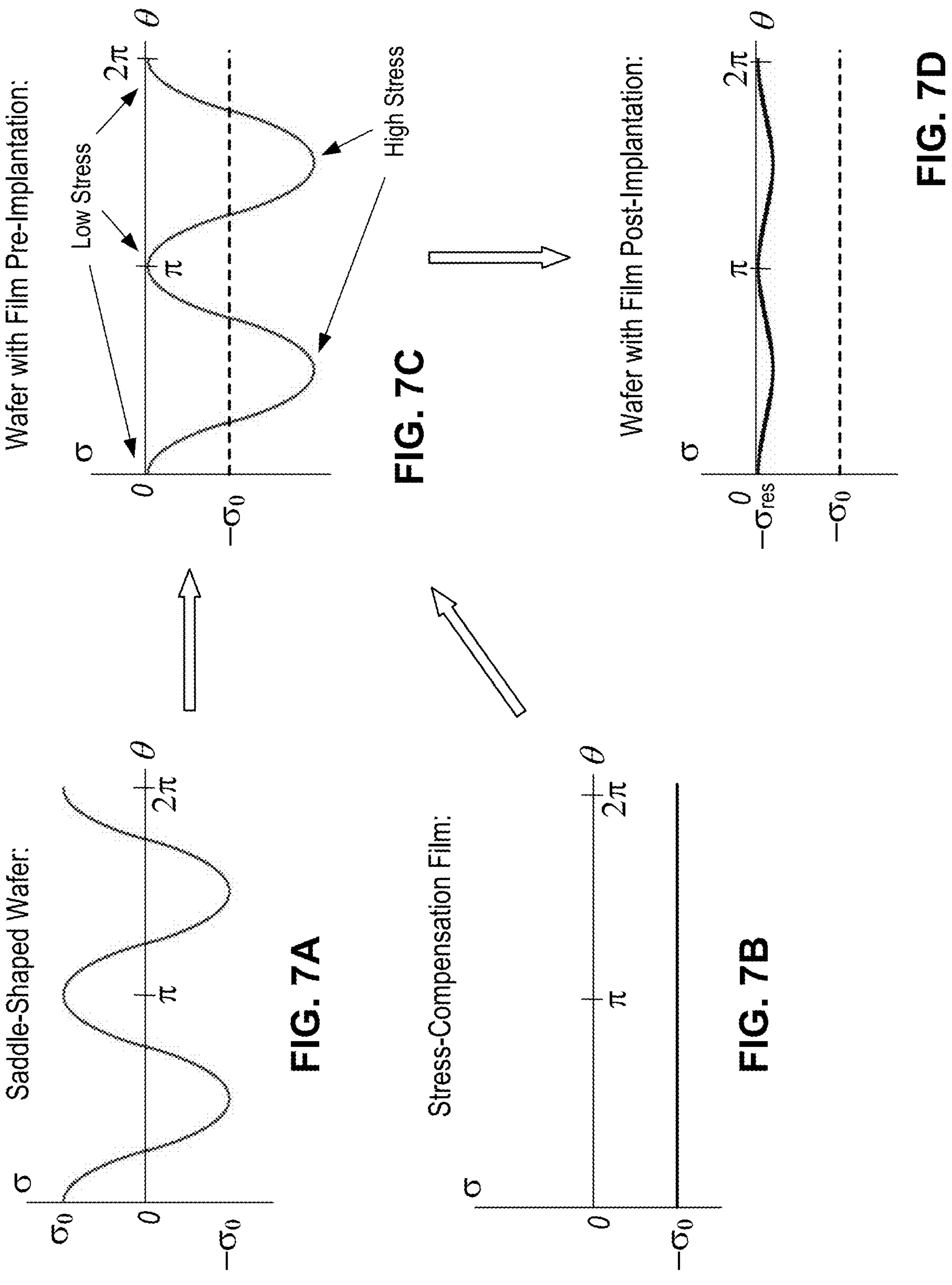
FIG. 7A illustrates a saddle-shaped stress of an example wafer, according to at least one embodiment.
FIG. 7B illustrates schematically selection of a target stress-compensation film based on an amplitude of the saddle portion of a wafer's stress, according to at least one embodiment.
FIG. 7C illustrates stress that exists in the wafer after the stress-compensation film has been deposited on the wafer, according to at least one embodiment.
FIG. 7D illustrates wafer stress mitigation caused by edge ion implantation into the stress-compensation film.

Based on the deformation expressed via $\{A_j\}$, process 600 may include determining the amplitude $\sigma_0$ in the hoop stress of the wafer $\sigma(R, \phi)=\sigma_0 \cos(2\phi)$ at the wafer's edge r=R. Such a determination may be made based on elastic properties (e.g., Young's modulus, Poisson's ratio, etc., of the wafer). FIG. 7A illustrates a saddle-shaped stress $\sigma_0 \cos(2\phi)$ of an example wafer, according to at least one embodiment. An amplitude $\phi_0$ of the saddle portion of stress can be used, at block 640 of FIG. 6, to identify properties (e.g., material and thickness) of a target stress-compensation film to be deposited on the wafer. The film can be selected in such as a way as to make the stress tensor in the new wafer+film structure of a definite sign (e.g., $\sigma(R, \phi)<0$). This is advantageous because ion implantation can reduce the amount of stress in the film while reversing the sign of the tension in the film with ions may be more difficult. FIG. 7B illustrates schematically selection of a target stress-compensation film based on determined amplitude $\sigma_0$, according to at least one embodiment. In some embodiments, the film's thickness may be selected (computed, simulated, etc.) to induce a uniform (paraboloid) deformation in the wafer that corresponds to uniform (or approximately uniform) stress $-\sigma_0$. At block 650 of FIG. 6, process 600 can include depositing the film of the selected material and thickness on the wafer. FIG. 7C illustrates stress that exists in the wafer after the stress-compensation film has been deposited on the wafer, according to at least one embodiment. As illustrated in FIG. 7C, the uniform downward shift by $\sigma_0$ imparted by the film causes the wafer to have locations of low stress (e.g., near angles $\phi=0$ and $\phi=\pi$, in this example) and locations of high stress (e.g., near angles $\phi=\pi/2$ and $\phi=3\pi/2$, in this example).

The wafer with the film deposited thereon and the stress illustrated in FIG. 7C has a cylindrical-type deformation that can be characterized by the following combination of $Z_4$ and $Z_6$ (and/or $Z_5$ for other choices of the coordinate system and, correspondingly, phase and $\alpha$), referred to as cylindrical polynomial $Z_{cyl}$ herein that is (up to a uniform) shift is equal to, $$Z_{cyl} = Z_6 + \frac{1}{\sqrt{2}}(Z_4 + \sqrt{3}) = 2\sqrt{6}\, r^2 \cos^2\phi.$$

The first term $Z_6$ corresponds to the stress of the wafer itself (cf. FIG. 7A) and the second term $-\sqrt{2}\, Z_4$ corresponds to the properly selected film-induced uniform stress (cf. FIG. 7B).

At block 660 of FIG. 6, doses for edge ion implantation can be computed, e.g., based on the amplitude $\sigma_0$ determined at block 640. Edge ion implantation performed into the stress-compensation film mitigates the stress in the film and, consequently, in the wafer, as illustrated in FIG. 7D. More specifically, edge ion implantation causes the hoop stress to reduce significantly in the magnitude, $$\sigma(R, \phi) = -2\sigma_0\cos^2\phi \to -2\sigma_{res}\cos^2\phi,\ \sigma_{res} \ll \sigma_0,$$

with a small residual hoop stress $\sigma_{res}$.

Figure 8A:
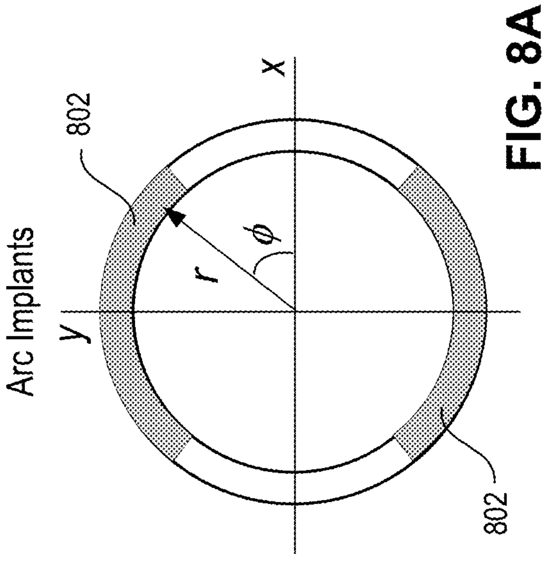
FIGS. 8A-D illustrate example ion implants that can be used for ion implantation performed for mitigation of saddle-shaped wafer deformation, according to at least one embodiment.

FIGS. 8A-D illustrate example ion implants that can be used for ion implantation performed for mitigation of saddle-shaped wafer deformation, according to at least one embodiment. FIG. 8A illustrates arc implants 802 in which a uniform ion implantation dose is applied within a certain equal-width edge area of a stress-compensation film, according to at least one embodiment. For example, a constant density $n_0$ of ions (e.g., defined as the flux of ions delivered by an ion beam multiplied by a beam exposure time) may be deposited within a segment of width d and angle $\phi_0$:

$$n(r, \phi) = n_0\Theta(R - r)\Theta(r + d - R)\Theta\big(\sin(\phi_0/2) - |\sin\phi|\big),$$

where $\Theta(\ )$ is the Heaviside step function. In some embodiments, angle $\phi_0$ may be equal or about 90°. In some embodiments, angle $\phi_0$ may be less than 90° (e.g., 60°, 45°, 30°, and so on) or more than 900 (e.g., 100°, 110°, 120°, and so on). In some embodiments, width of the edge implant can be within d≈1-10 mm. In some embodiments, the width of the edge implant can be less than 1 mm or more than 10 mm. In some embodiments, the width of the edge implant can be at or below 10% of a diameter of the wafer or some other fraction of the diameter (e.g., 5%, 20%, etc.)

Figure 8B:
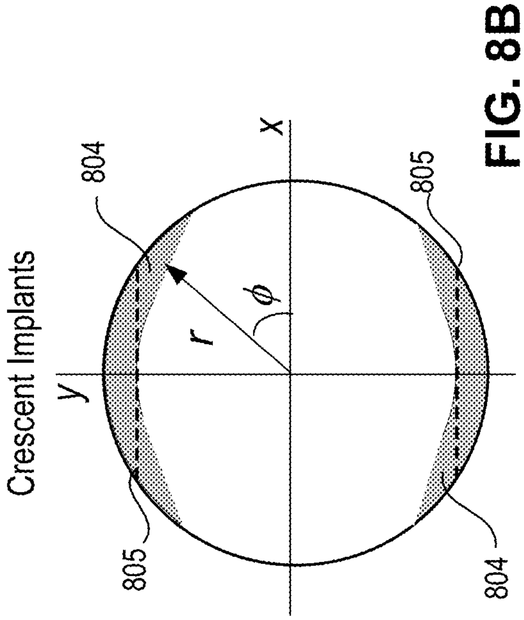

FIG. 8B illustrates crescent edge implants 804 in which a uniform ion implantation dose is applied within an edge area of varying (with the angle $\phi$) thickness $d(\phi)$, e.g., $$n(r, \phi) = n_0\Theta(R - r)\Theta(r + d(\phi) - R).$$

Thickness $d(\phi)$ can have maxima at $\phi\pm\pi/2$ and can vanish along the lines $\phi_0=\pm45°$ and $=\pm135°$ lines (or some other lines). In some embodiments, the inner boundaries of crescent implants 804 may be parallel to the horizontal axis in FIG. 8B (e.g., dashed line boundaries 805 indicated with the dashed lines), e.g., $$n(r, \phi) = n_0\Theta(R - r)\Theta(r|\sin\phi| + d - R).$$

Figure 8C:
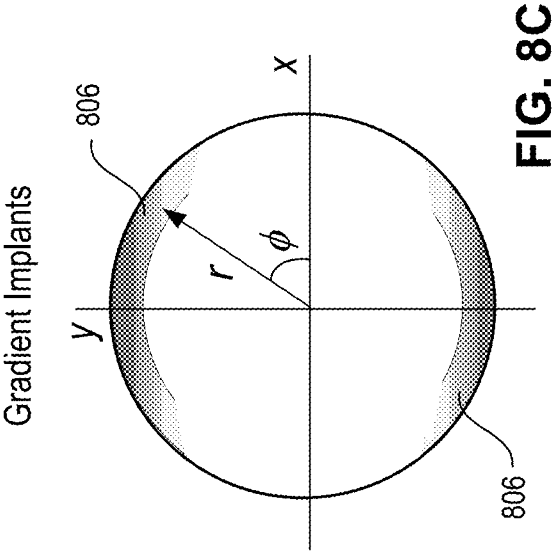

FIG. 8C illustrates gradient edge implants 806 in which a non-uniform ion implantation dose is applied within an edge area, according to at least one embodiment. In some embodiments, the ion implantation density can be varied linearly (or according to some non-linear dependence) with the radial distance r within the implant area, e.g., $$n(r, \phi) = \left(n_2 - \frac{R - r}{d}(n_2 - n_1)\right),$$

for R−d<r<R, and $\sin(\phi_0/2)<|\sin\phi|$ (while being zero otherwise). In this example, the ion implant density varies (e.g., increases) from $n_i$ at r=R−d to $n_2$ at r=R. In some embodiments, the ion implantation density can be varied with the vertical distance ($y=\sin\phi$) from the center of the wafer, e.g., $$n(r, \phi) = \left(n_2 - \frac{R - r|\sin\phi|}{d}(n_2 - n_1)\right)$$

In some embodiments, a non-uniform (with the azimuthal angle $\phi$) ion implantation dose may be applied to the film, e.g., as a piecewise-linear function of $\phi$, $$n(r,\phi)=n_0\Theta(R-r)\Theta(r+d-R)\begin{cases}\left|\phi-\frac{\pi}{2}\right|, & \frac{\pi}{4}<\phi<\frac{3\pi}{4},\\ \left|\phi+\frac{\pi}{2}\right|, & -\frac{3\pi}{4}<\phi<-\frac{\pi}{4},\\ 0, & \text{otherwise}\end{cases}.$$

In some embodiments, a smoothly varying (with the azimuthal angle $\phi$) ion implantation dose may be applied to the film non-uniform, e.g., a piecewise-linear function, $$n(r,\phi)=n_0\Theta(R-r)\Theta(r+d-R)\begin{cases}\sin^2\phi, & \frac{\pi}{4}<|\phi|<\frac{3\pi}{4},\\ 0, & \text{otherwise}\end{cases}.$$

Ion implantation doses that follow numerous other functions can be used, e.g., functions that are smoothly varying with both the radial distance and the azimuthal angle.

Figure 8D:
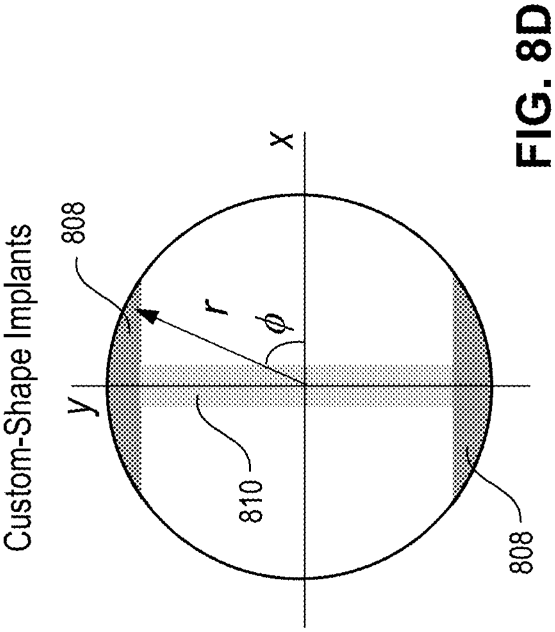

FIG. 8D illustrates custom-shaped ion implants, according to at least one embodiment. For example, custom-shaped implants can include any of the implants referenced in conjunction with FIGS. 8A-C (or similar implants). In one non-limiting example, custom-shaped implants can include crescent implants 808 and one or more longitudinal implants, e.g., implant 810. Crescent implants 808 and longitudinal implants 810 can have different ion implant density, e.g., crescent implants 808 can have a higher ion implant density compared with longitudinal implants 810. Longitudinal implants 810 can be used to prevent (or reduce) formation of ripples and/or other bulk deformation that can be caused by edge implants.

At block 670 of FIG. 6, ion implantation is performed, e.g., as illustrated as disclosed in conjunction with FIGS. 11A-B below, using one of the ion implantation doses (or any other similar doses) illustrated in FIG. 8A-D. Following ion implantation into the film, process 600 can continue, at block 680, with a new measurement of a shape of the wafer to evaluate post-implantation residual stress that remains in the wafer. For several reasons, the wafer after implantation can still display an amount of stress and deformation. In particular, edge implants may be able to mitigate stress around the wafer's circumference (the hoop stress) but some amount of residual (also referred to as higher-order stress herein) stress may still remain in the bulk of the wafer, causing variations in the wafer's profile (ripples). Additionally, the thickness of the stress-compensation film typically has a non-uniform radial profile near an edge, e.g., tapering off near the edge of a wafer, e.g., from about 300 nm at distance of 7-10 mm from the edge to about 150 nm right on the edge (as an illustrative example). This radial non-uniformity can further increase an amount of ripples.

Figure 9A:
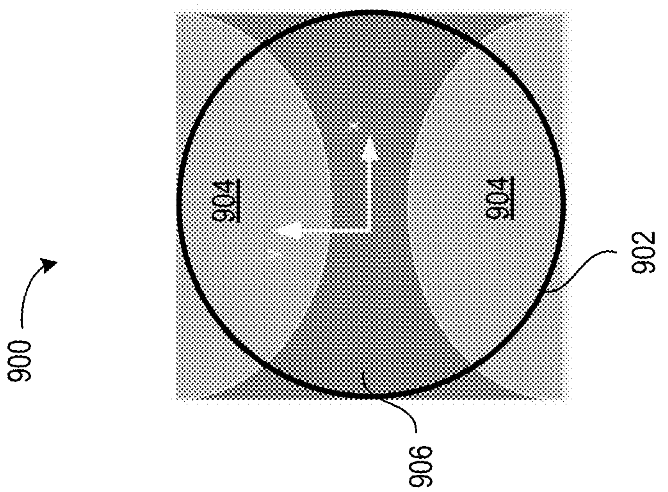
FIG. 9A-C illustrate some examples of implant assist features that can be used for mitigation of residual stresses, according to at least one embodiment.
Figure 9B:
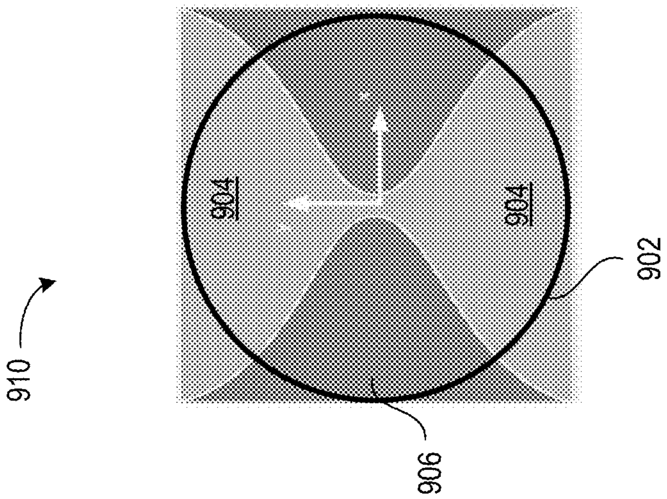
Figure 9C:
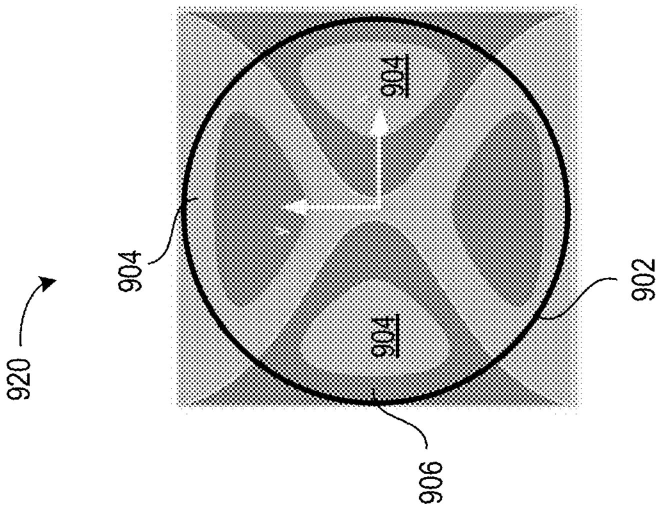

Referring back to FIG. 6, to reduce ripples and other residual deformations and stress in the wafer, process 600 can select, at block 690, one of additional implant assist features. FIG. 9A-C illustrate some examples of implant assist features that can be used for mitigation of residual stresses, according to at least one embodiment. FIG. 9A illustrates schematically an example "ovals" dose map 900 with brighter regions 904 indicating areas of wafer 902 that receive ions (or receive higher doses of ions) and darker regions 906 of wafer 902 that do not receive ions (or receive lower doses of ions). Similarly, FIG. 9B illustrates schematically an example "hourglass" dose map 910. FIG. 9C illustrates schematically an example "butterfly" dose map 920.

Various implant assist features 910-930 (as well as numerous other features) can be included in the selection process performed by block 690 of FIG. 6. In one example non-limiting embodiment, each implant assist feature can be encoded (and stored in computer memory) as a mask $M_j(x, y)$ that identifies areas that are to receive ion implants (index j enumerating various masks that have been defined). In some embodiments, masks $M_j(x, y)$ may be binary, e.g., $M_j(x, y)=1$ provided that point (x, y) belongs to one of bright regions 904 intended to receive the ions and $M_j(x, y)=0$ if point (x, y) belongs to one of dark regions 906 not intended to receive the ions. The residual stress $\sigma_{res}(x, y)$ measured in the wafer (or inferred from measurements of the residual deformation of the wafer) at step 680 may be compared to the available masks by computing a set of overlap factors (or any other suitable similarity values) representative of a similarity between the residual stress and the mask of the respective implant assist feature (the minus sign being used in the instances where the residual stress is negative, e.g., as illustrated in FIG. 7D), $$O_j=-\int\int dxdy\sigma_{res}(x,y)M_j(x,y),$$

where the integral (or a corresponding discrete two-dimensional sum) extends over the area of the circle. The implant assist feature with the highest overlap $O_j$ (or one of several highest overlaps) may be selected for application to the stress-compensation film on the wafer. The ion beam density can then be selected based on the magnitude of $\sigma_{res}(x, y)$, e.g., taken to be proportional to $\sigma_{res}(x, y)$, computed using Monte Carlo simulations, or by other suitable techniques. In some embodiments, mask $M_j(x, y)$ can be a continuous function of x, y.

At block 695, selected implant assist features can be applied to the stress-compensation film, e.g., as disclosed in conjunction with FIGS. 11A-B below. As indicated by the dashed arrow in FIG. 6, blocks 680-695 of process 600 can be repeated iteratively until stress or deformation of the wafer is reduced below a target tolerance.

Figure 10A:
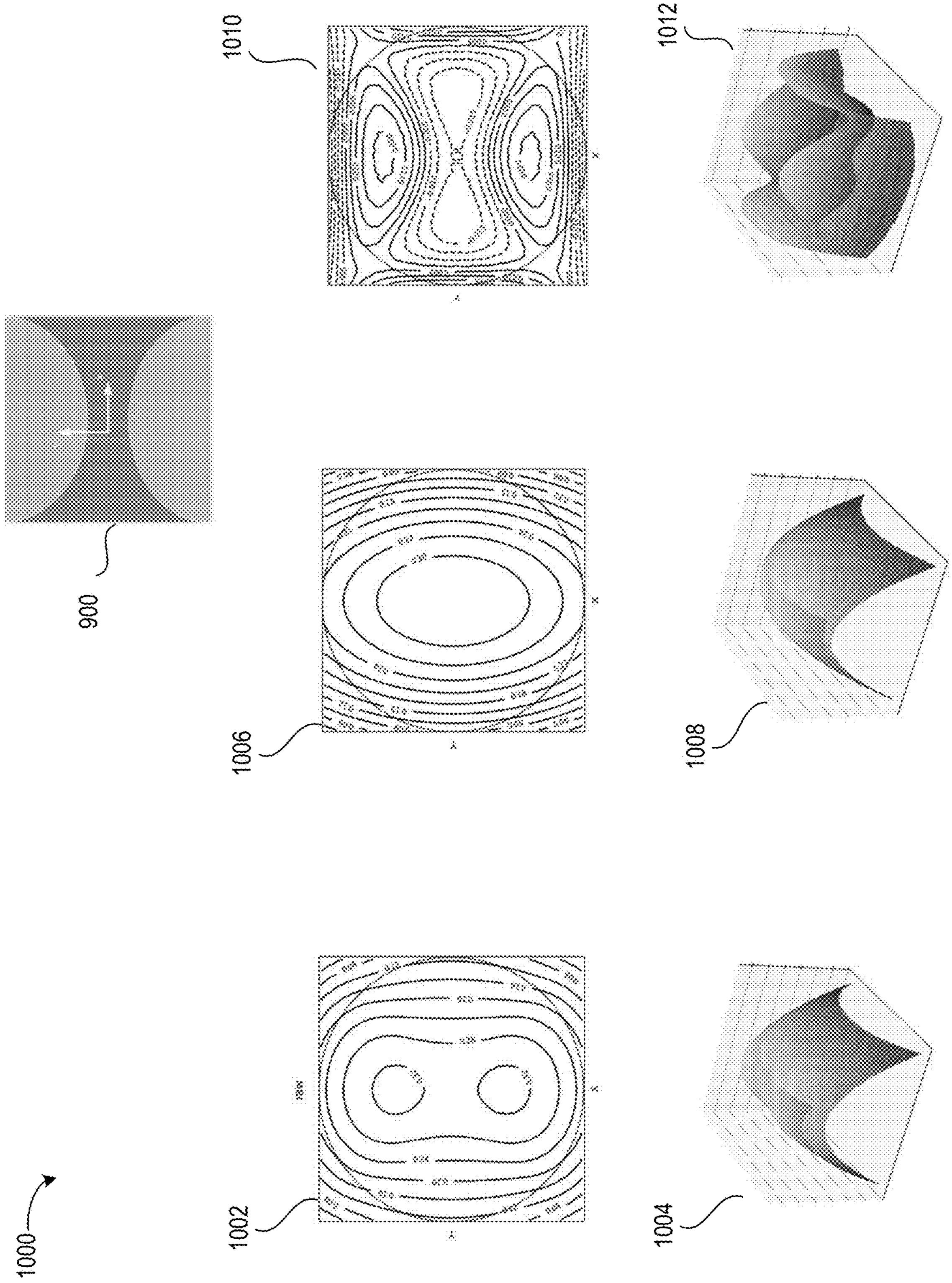
FIGS. 10A-B illustrate schematically a response of an example wafer to dose maps of FIG. 9A and FIG. 9C, according to at least one embodiment.
Figure 10B:
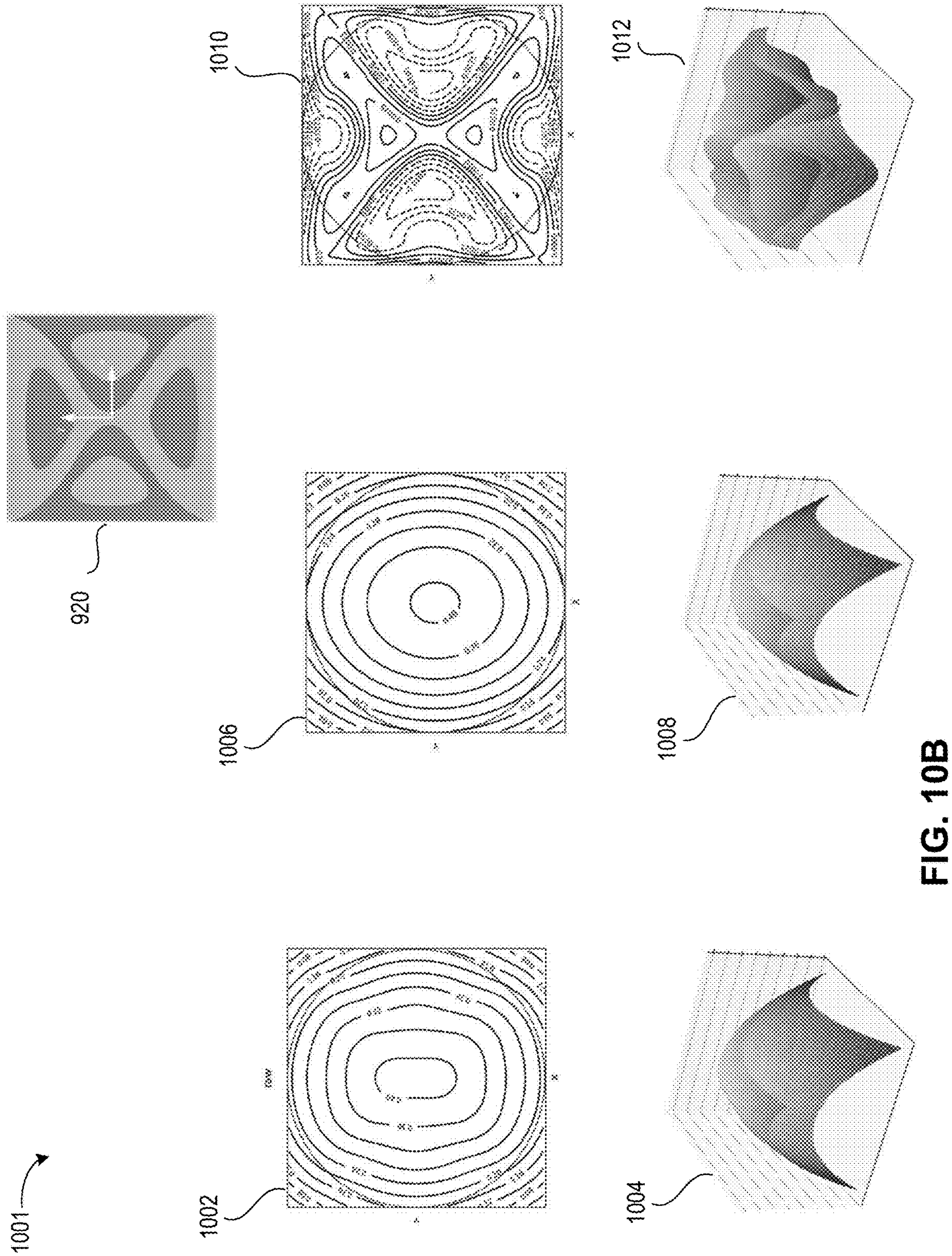

FIG. 10A illustrates schematically a response 1000 of an example wafer to an "ovals" dose map 900, which may be used in process 600 of FIG. 6, according to at least one embodiment. Response 1000 is computed for a reference undeformed wafer with a reference film deposited thereon. The deformation of the wafer following ion implantation is illustrated with a two-dimensional (2D) heat map 1002 and a three-dimensional (3D) map 1004. 2D heat maps 1006, 1008, and 3D maps 1008, 1010 illustrated decomposition of the wafer's deformation into a quadratic portion (2D map 1006 and 3D map 1008), which includes parabolic deformation and saddle deformation, and a residual portion (2D map 1010 and 3D map 1012). FIG. 10B illustrates schematically a response 1001 of an example wafer to a "butterfly" dose map 920, which may be used in process 600 of FIG. 6, according to at least one embodiment.

Figure 11A:
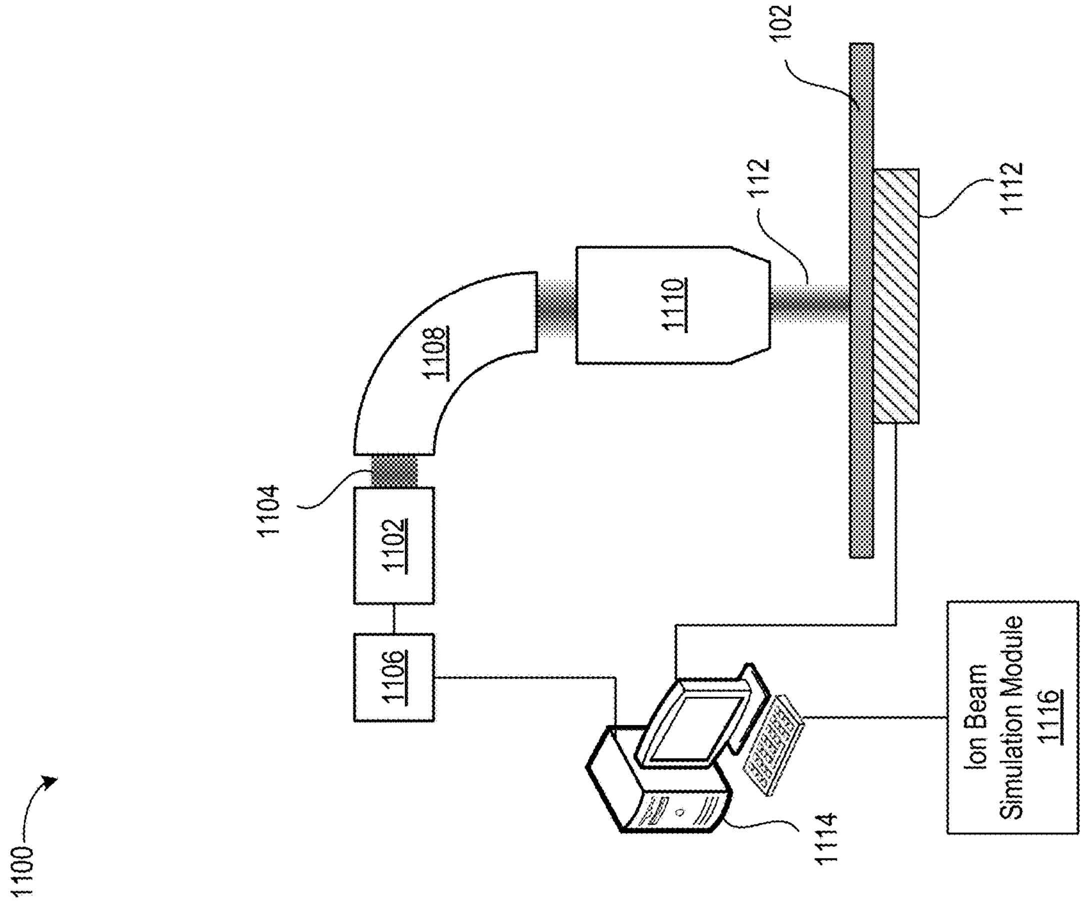
FIG. 11A illustrates schematically an ion implantation system capable of performing ion implantation into stress-compensation layers, according to at least one embodiment.
Figure 11B:
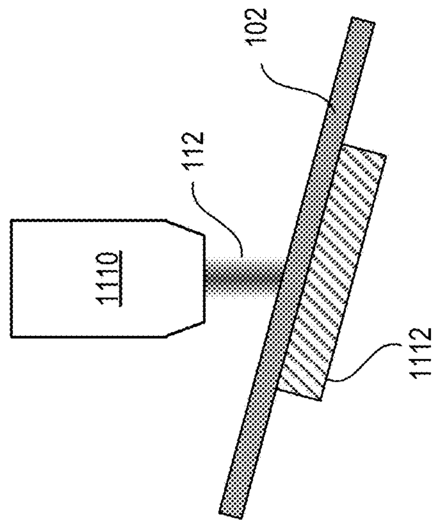
FIG. 11B illustrates a delivery of ions to a wafer at an arbitrary angle of incidence by the ion implantation system of FIG. 11A, in accordance to at least one embodiment.

FIG. 11A illustrates schematically an ion implantation system 1100 capable of performing ion implantation into stress-compensation layers, according to at least one embodiment. Ion implantation system 1100 can be or include ion beam implanter 110 of FIG. 1. Although, for the sake of specificity, a stress-mitigation beam that is used to modify the stress in a stress-compensation layer 108 is referred to as ion beam (e.g., ion beam 112), in some embodiments, the stress-mitigation beam can include other matter particles (e.g., electrons), electromagnetic waves (e.g., UV light, visible light, infrared light, etc.), and/or a suitable combination thereof. Ion implantation system 1100 can include and ion source 1102 for producing an ion beam 1104. Ion source 1102 can include a chamber for generating ions (e.g., a plasma chamber). Ion source 1102 can be powered by a power source 1106 and can include an extraction electrode assembly (not shown). Ion implantation system 1100 can include a mass spectrometer 1108 and a collimating and focusing column 1110. Collimating and focusing column 1110 can direct ion beam 112 to wafer 102. Wafer 102 can be supported by a support stage 1112. In some embodiments, support stage 1112 and wafer 102 can remain stationary during scanning of wafer 102 by ion beam 112 while components of ion implantation system 1100 can be repositioned relative to wafer 102. In some embodiments, ion implantation system 1100 can be stationary while support stage 1112 can reposition wafer 102. Scanning with ion beam 112 can occur along multiple directions, e.g., along x-axis and along y-axis according to any suitable predetermined pattern, e.g., back-and forth along x-axis, in a spiral pattern, and so on. In various embodiments, ion beam 112 can be scanned at a frequency of several Hz, tens of Hz, hundreds of Hz, thousands of Hz, or more.

Operations of ion implantation system 1100 can be controlled by a controller 1114, which can include any suitable computing device, microcontroller, or any other processing device having a processor, e.g., a central processing unit (CPU), a field-programmable gate array (FPGA), an application-specific integrated circuit (ASIC), and/or the like, and a memory device, e.g., a random-access memory (RAM), read-only memory (ROM), flash memory, and/or the like or any combination thereof. Controller 1114 can control operations of power source 1106, support stage 1112, and/or various other components and modules of ion implantation system 1100. Controller 1114 can include an ion beam simulation module 1116 capable of performing simulations that determine a target intensity of ion beam 112 to be used to mitigate various wafer deformations. In some embodiments, support stage 1112 can impart a tilt, e.g., in one or two spatial directions to wafer 102 to change an angle of incidence of ion beam 112 relative to wafer 102. In some embodiments, instead of tilting wafer 102, controller 1114 can cause a tilt of ion implantation system 1100 relative to wafer 102. In some embodiments, e.g., as illustrated in FIG. 11B, support stage 1112 can impart a tilt, e.g., in one or two spatial directions to wafer 102 to change an angle of incidence of ion beam 112 relative to wafer 102. In some embodiments, instead of tilting wafer 102, controller 1114 can cause a tilt of ion implantation system 1100 relative to wafer 102.

Figure 12:
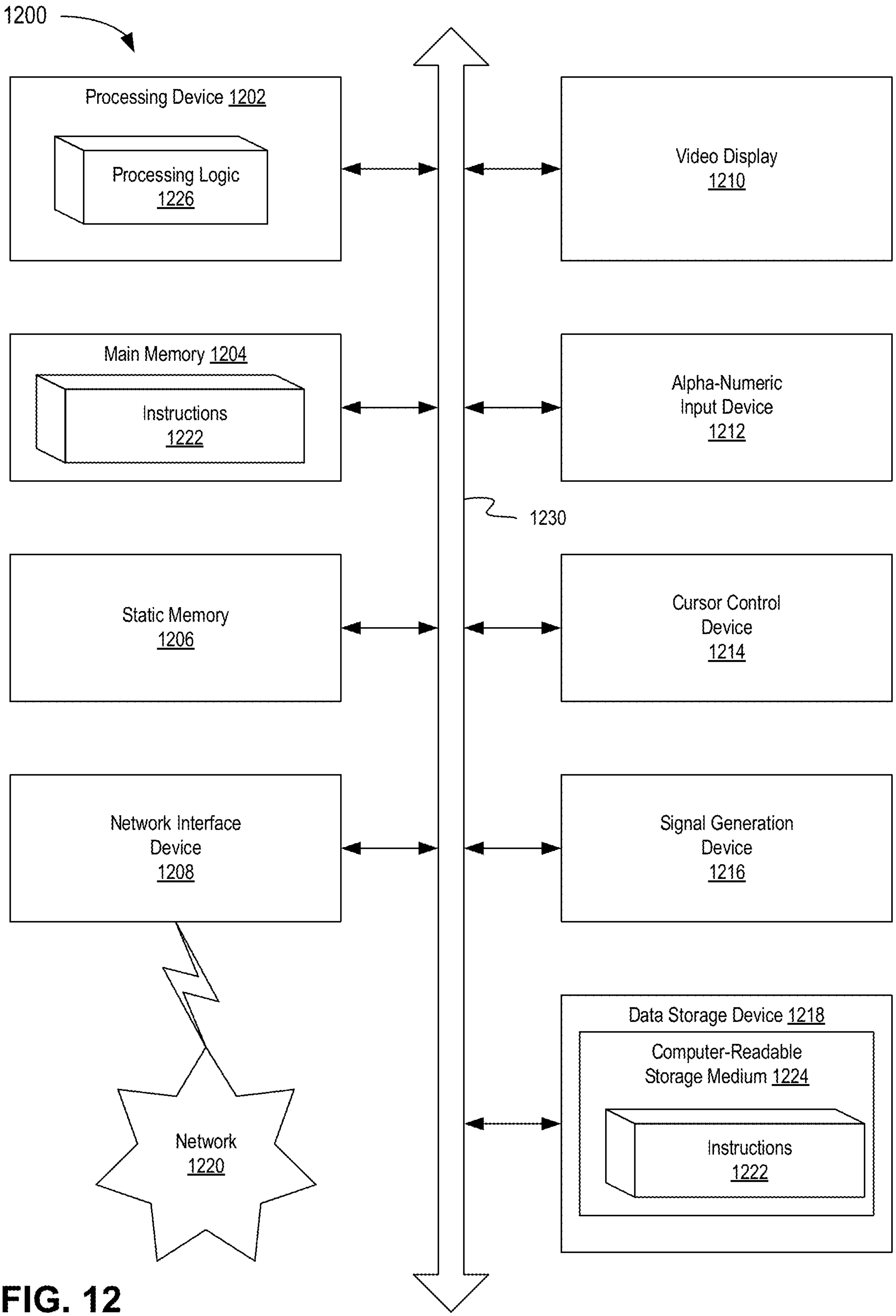
FIG. 12 depicts a block diagram of an example computer system capable of supporting operations of the present disclosure, according to at least one embodiment.

FIG. 12 depicts a block diagram of an example computer system 1200 capable of supporting operations of the present disclosure, according to at least one embodiment. In various illustrative examples, example computer system 1200 may be or include controller 1114 of FIG. 11. Example computer system 1200 may be connected to other computer systems in a LAN, an intranet, an extranet, and/or the Internet. Computer system 1200 may operate in the capacity of a server in a client-server network environment. Computer system 1200 may be a personal computer (PC), a set-top box (STB), a server, a network router, switch or bridge, or any device capable of executing a set of instructions (sequential or otherwise) that specify actions to be taken by that device. Further, while only a single example computer system is illustrated, the term "computer" shall also be taken to include any collection of computers that individually or jointly execute a set (or multiple sets) of instructions to perform any one or more of the methods discussed herein.

Example computer system 1200 may include a processing device 1202 (also referred to as a processor or CPU), a main memory 1204 (e.g., read-only memory (ROM), flash memory, dynamic random access memory (DRAM) such as synchronous DRAM (SDRAM), etc.), a static memory 1206 (e.g., flash memory, static random access memory (SRAM), etc.), and a secondary memory (e.g., a data storage device 1218), which may communicate with each other via a bus 1230.

Processing device 1202 represents one or more general-purpose processing devices such as a microprocessor, central processing unit, or the like. Processing device 1202 can include processing logic 1226. Processing device 1202 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. In accordance with one or more aspects of the present disclosure, processing device 1202 may be configured to execute instructions implementing example process 600 of mitigation of saddle-shaped deformations of wafers.

Example computer system 1200 may further comprise a network interface device 1208, which may be communicatively coupled to a network 1220. Example computer system 1200 may further comprise a video display 1210 (e.g., a liquid crystal display (LCD), a touch screen, or a cathode ray tube (CRT)), an alphanumeric input device 1212 (e.g., a keyboard), a cursor control device 1214 (e.g., a mouse), and an acoustic signal generation device 1216 (e.g., a speaker).

Data storage device 1218 may include a computer-readable storage medium (or, more specifically, a non-transitory computer-readable storage medium) 1224 on which is stored one or more sets of executable instructions 1222. In accordance with one or more aspects of the present disclosure, executable instructions 1222 may comprise executable instructions implementing example process 600 of mitigation of saddle-shaped deformations of wafers.

Executable instructions 1222 may also reside, completely or at least partially, within main memory 1204 and/or within processing device 1202 during execution thereof by example computer system 1200, main memory 1204 and processing device 1202 also constituting computer-readable storage media. Executable instructions 1222 may further be transmitted or received over a network via network interface device 1208.

While the computer-readable storage medium 1224 is shown in FIG. 12 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus may be specially constructed for the required purposes, or it may be a general purpose computer system selectively programmed by a computer program stored in the computer system. Such a computer program may be stored in a computer readable storage medium, such as, but not limited to, any type of disk including optical disks, CD-ROMs, and magnetic-optical disks, read-only memories (ROMs), random access memories (RAMs), EPROMs, EEPROMs, magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear as set forth in the description below. In addition, the scope of the present disclosure is not limited to any particular programming language. It will be appreciated that a variety of programming languages may be used to implement the teachings of the present disclosure.

It is to be understood that the above description is intended to be illustrative, and not restrictive. Many other embodiment examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A method to correct an out-of-plane deformation of a substrate, the method comprising:

obtaining, using optical inspection data, a profile of the out-of-plane deformation of the substrate;

identifying, using the obtained profile, one or more parameters characterizing a saddle-shaped stress of the substrate;

computing, using the one or more identified parameters, one or more characteristics of a stress-compensation layer (SCL) for the substrate;

causing the SCL to be deposited on the substrate; and causing a stress-mitigation beam to be applied to a plurality of edge regions of the SCL, wherein settings of the stress-mitigation beam are determined using the one or more identified parameters.

2. The method of claim 1, wherein the one or more characteristics of the SCL are computed to cause a stress in the substrate to have a same sign throughout an area of the substrate.

3. The method of claim 1, wherein each of the plurality of edge regions of the SCL has a width that is at or below 30% of a diameter of the substrate.

4. The method of claim 1, wherein the stress-mitigation beam applies a spatially uniform dose of ions to the plurality of edge regions of the SCL.

5. The method of claim 1, wherein the stress-mitigation beam applies a radially-varying dose of ions to the plurality of edge regions of the substrate.

6. The method of claim 1, wherein the stress-mitigation beam applies an azimuthally-varying dose of ions to the plurality of edge regions of the SCL.

7. The method of claim 1, wherein the one or more characteristics of the SCL comprise one or more of:

a material of the SCL, or a thickness of the SCL.

8. The method of claim 1, wherein settings of the stress-mitigation beam comprise one or more of:

a type of particles of the stress-mitigation beam, an energy of the particles of the stress-mitigation beam, or an angle of incidence of the particles of the stress-mitigation beam on the SCL.

9. The method of claim 1, further comprising:

responsive to the stress-mitigation beam being applied to the plurality of edge regions of the SCL, obtaining an updated profile of the out-of-plane deformation of the substrate;

identifying, based on the updated profile, a residual stress in the substrate;

selecting, based on the residual stress, a target stress-mitigation beam pattern from a plurality of stored stress-mitigation beam patterns; and causing an additional stress-mitigation beam to be applied to a plurality of regions of the SCL identified by the target stress-mitigation beam pattern.

10. The method of claim 9, wherein selecting the stress-mitigation beam pattern comprises computing a similarity of the residual stress in the substrate to each of at least a subset of the plurality of stored stress-mitigation beam patterns.

11. The method of claim 1, wherein the substrate comprises a front side and a back side, wherein the front side comprises one or more manufactured features, and wherein the SCL is deposited on the back side of the substrate.

12. A system comprising:

a memory; and a processing device communicatively coupled to the memory, the processing device to:

obtain, using optical inspection data, a profile of an out-of-plane deformation of a substrate;

identify, using the obtained profile, one or more parameters characterizing a saddle-shaped stress of the substrate;

compute, using the one or more identified parameters, one or more characteristics of a stress-compensation layer (SCL) for the substrate;

cause the SCL to be deposited on the substrate; and cause a stress-mitigation beam to be applied to a plurality of edge regions of the SCL, wherein settings of the stress-mitigation beam are determined using the one or more identified parameters.

13. The system of claim 12, wherein the one or more characteristics of the SCL are computed to cause a stress in the substrate to have a same sign throughout an area of the substrate.

14. The system of claim 12, wherein each of the plurality of edge regions of the SCL has a width that is at or below 30% of a diameter of the substrate.

15. The system of claim 12, wherein the stress-mitigation beam applies at least one of:

a spatially uniform dose of ions to the plurality of edge regions of the SCL, a radially-varying dose of ions to the plurality of edge regions of the substrate, or an azimuthally-varying dose of ions to the plurality of edge regions of the SCL.

16. The system of claim 12, wherein the one or more characteristics of the SCL comprise one or more of:

a material of the SCL, or a thickness of the SCL.

17. The system of claim 12, wherein settings of the stress-mitigation beam comprise one or more of:

a type of particles of the stress-mitigation beam, an energy of the particles of the stress-mitigation beam, or an angle of incidence of the particles of the stress-mitigation beam on the SCL.

18. The system of claim 12, wherein the processing device is further to:

responsive to the stress-mitigation beam being applied to the plurality of edge regions of the SCL, obtain an updated profile of the out-of-plane deformation of the substrate;

identify, based on the updated profile, a residual stress in the substrate;

select, based on the residual stress, a target stress-mitigation beam pattern from a plurality of stored stress-mitigation beam patterns; and cause an additional stress-mitigation beam to be applied to a plurality of regions of the SCL identified by the target stress-mitigation beam pattern.

19. The system of claim 18, wherein to select the stress-mitigation beam pattern, the processing device is to compute a similarity of the residual stress in the substrate to each of at least a subset of the plurality of stored stress-mitigation beam patterns.

20. A semiconductor manufacturing system comprising:

one or more processing chambers to process a substrate; and a computing device to:

obtain, using optical inspection data, a profile of an out-of-plane deformation of the substrate;

identify, using the obtained profile, one or more parameters characterizing a saddle-shaped stress of the substrate;

compute, using the one or more identified parameters, one or more characteristics of a stress-compensation layer (SCL) for the substrate;

cause the SCL to be deposited on the substrate; and cause a stress-mitigation beam to be applied to a plurality of edge regions of the SCL, wherein settings of the stress-mitigation beam are determined using the one or more identified parameters.

* * * * *